United States Patent
Ghanevati et al.

(10) Patent No.: US 10,879,851 B2
(45) Date of Patent: Dec. 29, 2020

(54) LOW NOISE AMPLIFIER WITH NOISE CANCELLATION

(71) Applicant: Northrop Grumman Systems Corporation, Falls Church, VA (US)

(72) Inventors: Manouchehr Ghanevati, Laguna Niguel, CA (US); Timothy R. LaRocca, Torrance, CA (US); John M. Trippett, Torrance, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 14 days.

(21) Appl. No.: 16/399,599

(22) Filed: Apr. 30, 2019

(65) Prior Publication Data
US 2020/0350870 A1 Nov. 5, 2020

(51) Int. Cl.
| | |
|---|---|
| H03F 1/26 | (2006.01) |
| H03F 3/195 | (2006.01) |
| H03F 3/30 | (2006.01) |
| H03F 3/68 | (2006.01) |
| G10K 11/178 | (2006.01) |

(52) U.S. Cl.
CPC ........... *H03F 1/26* (2013.01); *G10K 11/1785* (2018.01); *H03F 3/195* (2013.01); *H03F 2200/294* (2013.01)

(58) Field of Classification Search
USPC .................................................. 330/149, 151
See application file for complete search history.

(56) References Cited

U.S. PATENT DOCUMENTS

| | | |
|---|---|---|
| 3,944,943 A | 3/1976 | Reed |
| 9,735,737 B2 | 8/2017 | Gorbachov |

(Continued)

FOREIGN PATENT DOCUMENTS

| | | |
|---|---|---|
| CN | 101997489 | 3/2011 |
| CN | 102394571 | 3/2012 |

OTHER PUBLICATIONS

F. Bruccoleri, E. Klumperink, and B. Nauta, "Noise cancelling in wideband CMOS LNAs," in IEEE ISSCC Dig. 2002, pp. 406-407.

(Continued)

*Primary Examiner* — Hieu P Nguyen
(74) *Attorney, Agent, or Firm* — McCracken & Gillen LLC (57) ABSTRACT

An exemplary embodiment of a low noise amplifier has integral noise cancellation to provide a low noise figure and operation over a frequency range of 40 GHz-60 GHz. An amplifier amplifies an input signal as well as noise present with the amplified signal and amplified noise being out of phase and in phase, respectively, with the corresponding inputs. An auxiliary amplifier amplifies the same inputs and generates an amplified signal and amplified noise both being out of phase relative to the inputs. A summation circuit combines all of these amplified signals with the noise being cancelled since the auxiliary amplifier provides the same amount of amplification as the amplifier and the amplified noise signals being summed are 180 degrees out of phase to each other. Preferably, the amplifier, auxiliary amplifier and the summation device utilize CMOS transistors disposed on an SOI substrate with impedance stabilization over the frequency range.

20 Claims, 4 Drawing Sheets

(56) References Cited

U.S. PATENT DOCUMENTS

| | | | |
|---|---|---|---|
| 10,680,566 B2* | 6/2020 | Li | H03F 1/26 |
| 2008/0055005 A1 | 3/2008 | Nam et al. | |

OTHER PUBLICATIONS

N. Kim, V. Aparin, K. Barnett, and C. Persico, "A cellular-band CDMA CMOS LNA linearized using active post distortion," IEEE J. Solid-State Circuits, vol. 41, No. 7, pp. 1530-1534, Jul. 2006.

T.-S. Kim and B.-S. Kim, "Post-linearization of cascode CMOS LNA using folded PMOS IMD sinker," IEEE Microw. Wireless Comp. Lett., vol. 16, No. 4, pp. 182-184, Apr. 2006.

H. Zhang, X. Fan, and E. Sanchez-Sinencio, "A low-power, linearized, ultra-wideband LNA design technique," IEEE J. Solid-State Circuits, vol. 44, No. 2, pp. 320-330, Feb. 2009.

W.Li, J. Tsai, H. Yang, W. Chou, S. Gea, H. Lu, and T. Huang, "Parasitic-Insensitive Linearization Methods for 60-GHz 90-nm CMOS LNAs", IEEE Trans. Microw. Theory Tech., vol. 60, No. 8, pp. 2512-2523, Aug. 2012. (appear in both the DS method and post-distortion category because it talks about both methods).

D. Im, I. Nam, H. Kim, and K. Lee, "A Wideband CMOS Low Noise Amplifier Employing Noise and IM2 Distortion Cancellation for a Digital TV Tuner", IEEE J. Solid-State Circuits, vol. 44, No. 3, pp. 686-698, Mar. 2009.Wireless LAN Medium Access Control (MAC) and Physical Layer (PHY) Specification, IEEE Std. 802.11, 1997.

T. W. Kim, and B. Kim, "A 13-dB IIP3 Improved Low-Power CMOS RF Programmable Gain Amplifier Using Differential Circuit Transconductance Linearization for Various Terrestrial Mobile D-TV Applications", IEEE J. Solid-State Circuits, vol. 41, No. 4, pp. 945-953, Apr. 2006.

B. Ulicki, SOI Condortium, SOI Fundamentals, copyright 2009.

Namsoo Kim, Vladimir Aparin, Kenneth Barnett, and Charles Persico, A Cellular-Band CDMA 0.25-µm CMOS LNA Linearized Using Active Post-Distortion, IEEE J. Solid-State Circuits, vol. 41, No. 7, pp. 1530-1534, Jul. 2006.

Hankyu Lee, Taeyoung Chung, Heesong Seo, Inyoung Choi, and Bumman Kim, A Wideband Differential Low-Noise-Amplifier IM3 Harmonics and Noise Canceling, IEEE Microwave and Wireless Components Letters, vol. 25, No. 1, pp. 46-48, Jan. 2015.

Stephan C. Blaakmeer, Eric A. M. Klumperink, Domine M. W. Leenaerts, and Bram Nauta, Wideband Balun-LNA With Simultaneous Output Balancing, Noise-Canceling and Distortion-Canceling, IEEE J. of Solid-State Circuits, vol. 43, No. 6, pp. 1341-1350, Jun. 2008.

Takao Kihara, Toshimasa Matsuoka, and Kenji Taniguchi, A 1.0 V, 2.5 mW, Transformer Noise-Canceling UWB CMOS LNA, 2008 IEEE Radio Frequency Integrated Circuits Symposium, pp. 493-496.

David Murphy, Hooman Darabi, AsadAbidi, Amr A. Hafez, Ahmad Mirzaei, Mohyee Mikhemar, and Mau-Chung Frank Chang, A Blocker-Tolerant, Noise-Cancelling Receiver Suitable for Wideband Wireless Applications, IEEE J. of Solid-States Circuits, vol. 47, No. 12, pp. 1-42, Dec. 2012.

Federico Bruccoleri, Eric A. M. Klumperink, and Bram Nauta, Wide-Band CMOS Low-Noise Amplifier Exploiting Thermal Noise Canceling, IEEE J. of Solid-State Circuits, vol. 39, No. 2, pp. 275-282, Feb. 2004.

International Search Report and Written Opinion in related PCT Application No. PCT/US2020/021355, dated Jun. 10, 2020, 26 pages.

International Search Report and Written Opinion in related PCT Application No. PCT/US2020/026104, dated Jul. 6, 2020, 47 pages.

Jangjoon Lee et al., "Wide Dynamic Range, 0.8 to 6 GHz LNA in 45 nm Digital SOI CMOS", Circuits and Systems (ICAS), 2011 IEEE International Symposium on, IEEE, May 15, 2011, pp. 1792-1795.

C. Majek et al., "60 GHz Cascode LNA with Interstage Matching: Performance Comparison Between 130nm BiCMOS and 65nm CMOS-SOI Technologies", Signals, Circuits and Systems (SCS), 2009 3rd International conference on, IEEE, Piscataway, NJ, Nov. 6, 2009, pp. 1-5.

Yi Qiang Wu et al, "Wideband Noise Cancelling LNA with Tunable Active Inductor for DRM/DAB Receiver", Mirowave and Millimeter Wave Technology (ICMMT), 2012 International Conference on, IEEE, May 5, 2012, pp. 1-4.

* cited by examiner

LOW NOISE AMPLIFIER WITH NOISE CANCELLATION

BACKGROUND

Embodiments of this invention relate to low noise amplifiers having noise cancellation and are suited for, but not limited to, implementation as semiconductor devices for amplification of signals at millimeter wave frequencies and wideband CMOS applications.

Cancellation techniques have been employed especially in low-frequency electronic devices in order to minimize the presence of an undesired signal. For example, a replica of an undesired signal that is 180° out of phase with the undesired signal can be combined or added to the undesired signal in an effort to minimize the magnitude of the undesired signal. Under a "perfect" condition in which the replica signal is exactly 180° out of phase and has an equal magnitude to the undesired signal, adding these signals together will result in substantially total cancellation.

Cancellation of an unwanted signal using the above explained technique becomes much more difficult at higher frequencies, e.g. millimeter wave frequencies. It becomes increasingly more difficult to generate the "perfect" replica signal at higher frequencies due to challenges in maintaining the perfect 180° out of phase relationship as well as an equal magnitude to the signal to be canceled. Even more challenges are present when the signal to be canceled is associated with an amplifier, especially where the amplifier operates over a substantial range of high frequencies.

SUMMARY

It is an object of embodiments of the present invention to satisfy the need for a low noise amplifier with noise cancellation, especially but not limited to, an amplifier that operates over a substantial range of millimeter wave frequencies while providing a low noise figure.

An exemplary embodiment of a low noise amplifier has integral noise cancellation to provide a low noise figure and operation over a frequency range of 40 GHz-60 GHz. A semiconductor amplifier amplifies an input signal as well as noise present with the amplified signal and amplified noise being out of phase and in phase, respectively, with the corresponding inputs. An auxiliary semiconductor amplifier amplifies the same inputs and generates an amplified signal and amplified noise both being out of phase relative to the inputs. A summation circuit combines all of these amplified signals with the noise component being cancelled since the auxiliary amplifier provides the same amount of amplification as the amplifier and the amplified noise signals being summed are 180 degrees out of phase to each other. Preferably, the amplifier, auxiliary amplifier and the summation device utilize CMOS transistors disposed on an SOI substrate with impedance stabilization over the frequency range.

DESCRIPTION OF THE DRAWINGS

Features of exemplary implementations of the invention will become apparent from the description, the claims, and the accompanying drawings in which:

DETAILED DESCRIPTION

One aspect of embodiments of the present invention resides in the recognition that by providing noise cancellation for noise associated with a first amplification stage of a LNA by utilizing a secondary amplification stage and signal summation to achieve noise cancellation, the noise at the output of the LNA circuitry will be primarily determined by only the noise associated with secondary amplification and summation stages. The secondary and summation stages can be selected and configured to achieve very low noise figure even at millimeter wave frequencies of operation.

Figure 1:
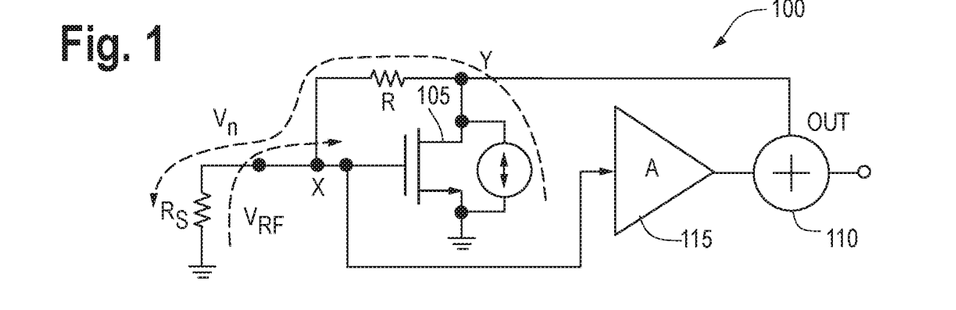
FIG. 1 is a simplified schematic diagram showing the concepts of a low noise amplifier with noise cancellation in accordance with embodiments of the present invention.

FIG. 1 shows a simplified schematic diagram showing the concepts of a low noise amplifier with noise cancellation in accordance with embodiment 100 of the present invention. A common source transistor 105 provides an amplification stage with its output Y coupled to one input of the summation stage 110. The input X to transistor 105 also provides an input to inverting amplifier 115 whose output is connected to the other input of the summation stage 110. The resistor $R_s$ represents the resistance of the input signal source and resistor R is the feedback resistance resulting in the amplification provided by the amplification stage of: $Y=X*(1-g_m*R)$. The noise amplification factor from node X to node Y is $1+R/R_s$.

The input signal voltage $V_{rf}$ at X is amplified to provide a voltage at Y that is amplified and 180° out of phase with $V_{rf}$ voltage, if $g_m*R$ is >1. The voltage Vn represents the noise voltage which has the same phase at the input and output of transistor 105. The 180° phase inversion provided by amplifier 115 results in the signal $V_{rf}$ as inverted by amplifier 115 having the same phase as the signal $V_{rf}$ at Y, and hence the signals are in phase and additive in magnitude at the output of the summation 110. However, the 180° phase inversion provided by amplifier 115 results in the noise Vn from X being amplified and 180° out of phase with the noise at Y at the output of the amplifier 115. Hence the noise signals as combined at the summation circuit 110 are subtractive, i.e. out of phase with opposite magnitudes, at the output of the summation circuit 110. To maximize noise cancellation, the amplification provided by amplifier 115 should be $-(1+R/R_s)$ so that the magnitude of noise provided at the output of amplifier 115 is the same magnitude as the noise at Y but with the opposite phase. With the noise of the input amplifier stage 105 being canceled, the noise of the overall circuit is then substantially determined only by the noise of the secondary stage, amplifier 115, and the summation circuit 110. The summation circuit 110 could be a "Y" connection of three resistors or use active devices, e.g. transistors, to combine the two signal paths.

Figure 2:
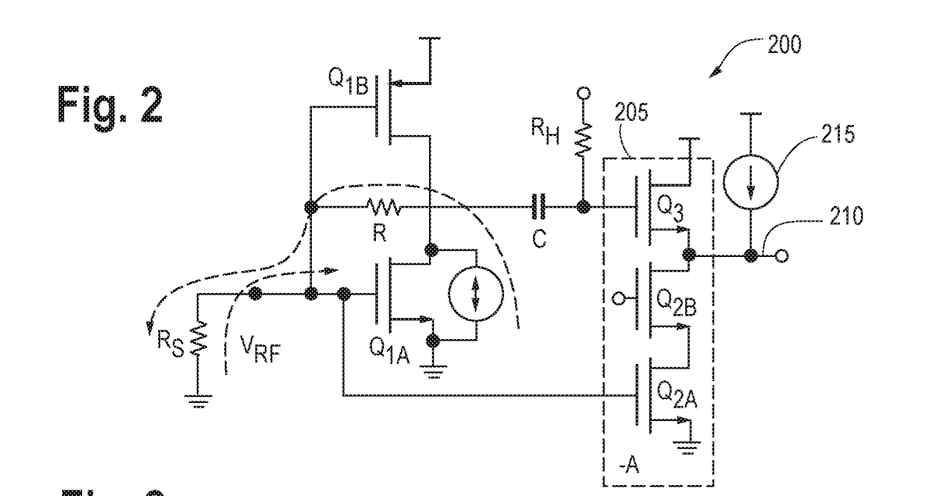
FIG. 2 is a schematic diagram of an embodiment of a low noise amplifier with noise cancellation in accordance with an embodiment of the present invention.

FIG. 2 shows a more detailed schematic diagram of an embodiment 200 of a low noise amplifier with noise cancellation in accordance with the present invention. The same basic principles for noise cancellation are utilized in embodiment 200 as explained for the embodiment 100. A matching amplifier Q1B is implemented as a resistive feedback inverter that operates in conjunction with amplifier Q1A to form the amplification stage. The overall transconductance gain for the amplifier stage is $g_m=g_{m,nmos}+g_{m,pmos}$, i.e. the sum of the gains for Q1A and Q1B. It should be noted that as the physically implemented device sizes increase, the drain to source resistance, $R_{ds}$, decreases which causes the noise signal to leak back into the channel and not be cancelled. Furthermore, both active input amplification devices exhibit input parasitic capacitance resulting in noise signal leakages that are frequency dependent.

The combined secondary stage and adder 205 is implemented as source follower Q3 on top of a cascode common source amplifier Q2A and Q2B. The noise voltage gain A (=−(1+R/Rs)) is equal to the $-g_{m2A}/g_{m3}$. Therefore, the Q2A device should be physically sized A times larger than Q3 to achieve the correct gain so that the magnitude of the noise signal coming from the drain of Q2B is the same as the magnitude of the noise signal coming from the source of Q3. This implies that the gain of the output from drain of the amplifier Q1A is "A". Sizing must be considered since if the size of Q2A is too much larger than the input capacitance at the gates of Q1A and Q1B, Cgs2 (gate to source capacitance of Q2A) will affect the input matching. A separate current source 215 can be used to help steer the current from the common-source cascode devices, Q2A and Q2B, since they are much larger than the source follower Q3. A high pass filter, capacitor C and resistor $R_h$, filters the amplified signal as coupled to the input gate of Q3. Bias voltages are not shown but will be apparent to those skilled in the art in view of the later discussed embodiments.

Figure 3:
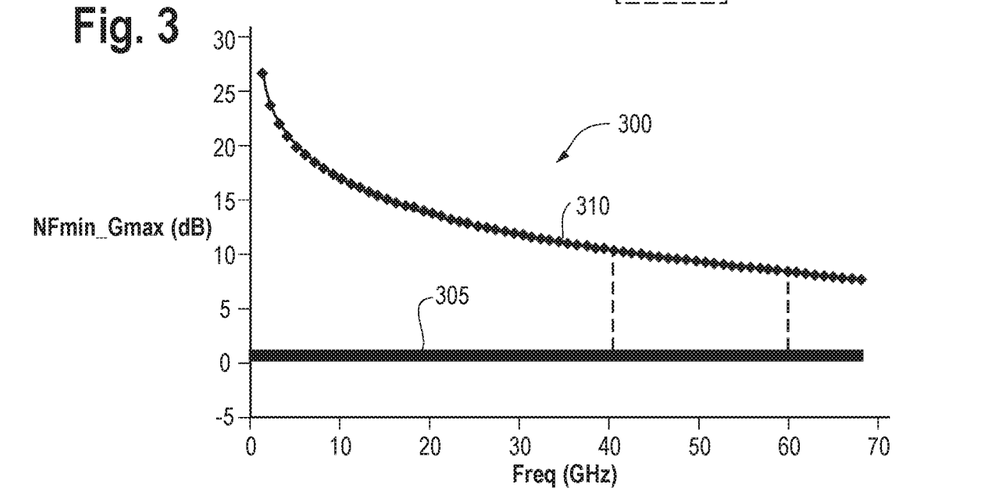
FIG. 3 is a graph illustrating a noise figure and gain anticipated for a 72 μm CMOS semiconductor device using 45 nm 12 SIO (silicon on insulator).

FIG. 3 shows a graph illustrating a noise FIG. 305 and gain 310, both in decibels, anticipated for a 72 μm CMOS semiconductor device using 45 nm 12 SIO (silicon on insulator) technology with operation at 0.8v and 10 mA for the frequencies as shown. It will be noted that the noise figure is less than 3 db at 60 GHz, about 2 db at 40 GHz, and is lower than that at lower frequencies. A maximum gain at 40 GHz is about 11 db and falls substantially linearly to just under 10 db at 60 GHz. This demonstrates the suitability for use in embodiments of the present invention.

Figure 4:
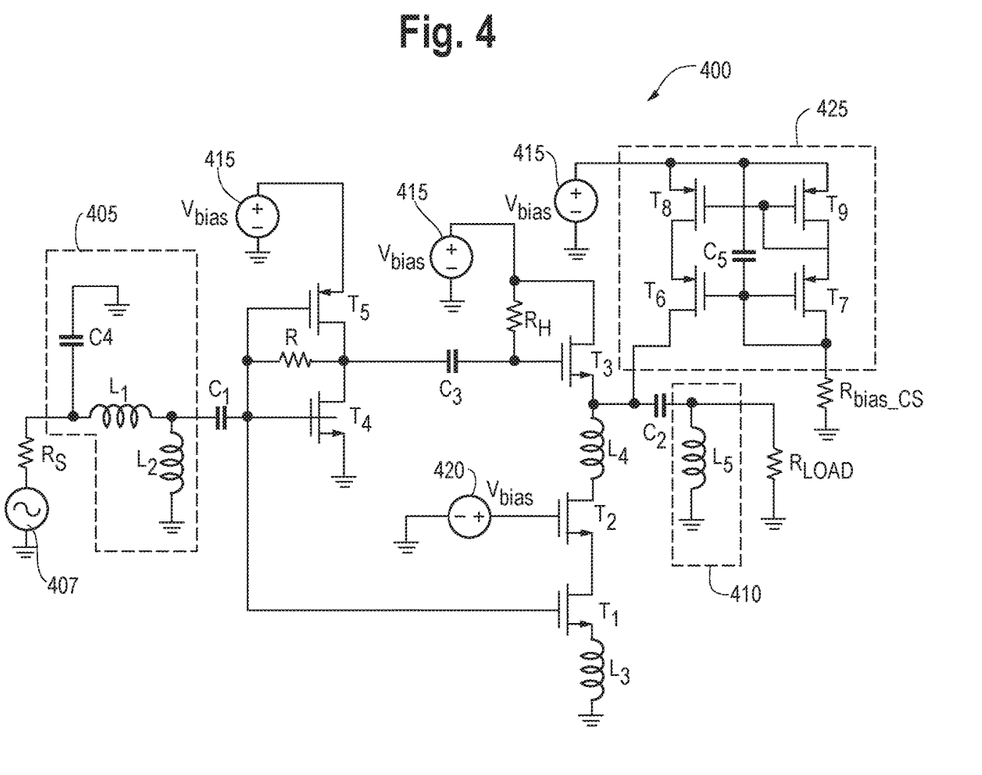
FIG. 4 is a more detailed schematic diagram of a low noise amplifier with noise cancellation in accordance with an embodiment of the present invention suitable for operation at millimeter wave frequencies.

FIG. 4 shows a more detailed schematic diagram of an embodiment 400 of a low noise amplifier with noise cancellation suitable for operation over a range of millimeter wave frequencies, i.e. from 40 GHz to 60 GHz. Embodiment 400 is substantially similar to embodiment 200 and operates using the same principles. Thus, only differences between these embodiments will be primarily discussed. The 5 active devices in embodiment 200 correspond to the respective 5 devices, T1-T5, in similar circuit locations in embodiment 400 where each respective transistor performs a corresponding function.

A matching network 405 together with capacitor C1 form an input matching network to provide impedance matching between the signal source 407 and the gates of the primary amplification stage provided by transistors T4 and T5. Similarly, matching network 410 together with capacitor C2 form an output matching network to provide impedance matching between the amplified output, i.e. the source of transistor T3, and the next stage to receive the amplified signal as represented by resistor Rload. In the exemplary embodiment 400, the amplifier is suited for millimeter wave operation from 40 GHz to 60 GHz. DC supply voltage sources 415 are provided as shown to power the active devices. As will be understood, the DC bias voltage source 420 associated with the gate of transistor T2 will be set to an appropriate DC voltage to bias the transistor T2 to an active linear region of operation.

Embodiment 400 provides an implementation of a current source 425 and input and output matching networks, 405 and 410, that enhances broadband operation at the millimeter wavelength (MMW) frequencies. A successful noise cancelling (NC) LNA for MMW applications with a 20 GHz range of operation is challenging. Gain selection of the auxiliary amplifier T1/T3 is preferably based on the voltage amplification ratio of the noise signal in the input stage T4/T5. Effective cancellation of noise from the input stage will not occur at the output if significant interstage impedance mismatches or noise current leakage are present. However, implementation of matching networks at Gigahertz frequencies provide complications such as adding parasitics. For example, inductors, in general as well as inductors implemented in CMOS technology, exhibit self-resonance-frequency (SRF) based on the values of inductance and parasitic capacitance of the inductor itself. There is also resistive loss associated with inductors. These factors may adversely impact the bandwidth (BW) of operation. In view of these considerations, the gain of the input amplifier stage should preferably be higher, e.g. 5 times higher, than the unloaded gain of the auxiliary amplifier. This can be achieved by selecting a high $R/R_s$ ratio that is substantially larger, e.g. more than 5 times larger, than the gain of the auxiliary amplifier (i.e., $|1+R/R_s|>g_{m2}/g_{m3}$). As transistors T1 and T2 have identical size, gains $(g_{m1}/g_{m3})=(g_{m2}/g_{m3})$. A higher input stage gain also reduces noise contribution of the feedback resistor R since the noise is scaled down by input stage gain.

As noise contribution of the input stage and feedback resistor is now minimized, the noise associated with the output stage (auxiliary amplifier plus adder) will dominate the overall LNA noise. Increasing $g_{m1}$ and $g_{m2}$ can result in higher output stage gain and thereby reduction in noise. One way to achieve this is by steering current from an external current source. Since transistors T1 and T2 have higher gm values than transistor T3, transistors T1 and T2 can carry more DC current without interfering with current through transistor T3. Therefore, an external current source can be used to supply current to only transistors T1 and T2. A simple current source that does not provide sufficient isolation from the auxiliary amplifier will result in degrading the noise performance and frequency response at MMW frequencies. To overcome this, a cascode current source 425, with transistors T6-T9 and bypass capacitor C5, is used to reduce any undesired loading effects on the auxiliary amplifier.

Additional enhancements assist in more effective operation at MMW frequencies over an extended bandwidth. Specifically, inductive degeneration is incorporated in the output stage to enhance noise reduction. For example, the use of an inductor L3 in series with the source of T1 and an inductor L1 in series with amplification stage internal input capacitance, Cgs, results in a desired real input impedance over much of the frequency bandwidth. The use of inductive degeneration by L3 results in improved performance over a wide frequency range. Proper selection of L3 is a balance between input impedance and broadband matching on one hand and noise factor (NF) performance. A parasitic reduction technique can be applied to the auxiliary amplifier by inserting an inductor L4 between source of T3 and drain of common gate transistor T2. This has the effect of counteracting/reducing the overall series capacitance Cgs for T3 and Cds for T2. The inductor L4, with a value selected based on device size and the parasitic capacitance of L4, helps to effectuate matching between T2 and T3 resulting in optimum current flow and increased gain in the system. In effect, the inductor L4 transforms the highly capacitive output impedance (looking into drain of T2) to a lower impedance value where current flows more effectively between the two transistors. This correction is preferably optimized so that frequency stability is not compromised as a result of higher gain and that output return loss is also not compromised. For example, for 45 nm 12SOI technology, depending on device sizes T1/T2, L4 can range between 80-150 pH for low power applications. A gate resistor $R_h$ of few kilo ohms is used to further reduce the noise figure as a result of auxiliary stage loading effects. The combination of the series capacitance between the drains of T4/T5 and $C_{gs}$ of T3 together with the gate resistance $R_h$ forms a high-pass filter. The high pass filter sets the low frequency of the desired frequency range of operation. For MMW applications, a low loss capacitor value a fraction of one pico Farad can be used.

The inductors are important in impedance matching especially at MMW frequencies and are preferably characterized for their inductance value, Q factor, and SRF. All inductors should preferably exhibit SRF beyond 100 GHz for operation of the amplifier over the 40 GHz-60 GHz range. Furthermore, it is expected that the inductors in SOI technology will suffer less ohmic loss compared with inductors implemented in Bulk Silicon.

To further enhance the frequency of operation and BW, a broadband input matching network 405 should be used. The input and output DC blocking capacitors C1, C2 are preferably incorporated as part of the input and output matching circuits. This is preferred as these capacitors will typically be small, e.g. <1 pF, at MMW frequencies and pose smaller parasitic and loss. The combination of shunt inductor (L2=106 pH), series inductor (L1=100 pH), and shunt capacitor (C4=26.5×10$^{-15}$ Farad) provide a wideband impedance transformation to the source impedance.

Figure 5:
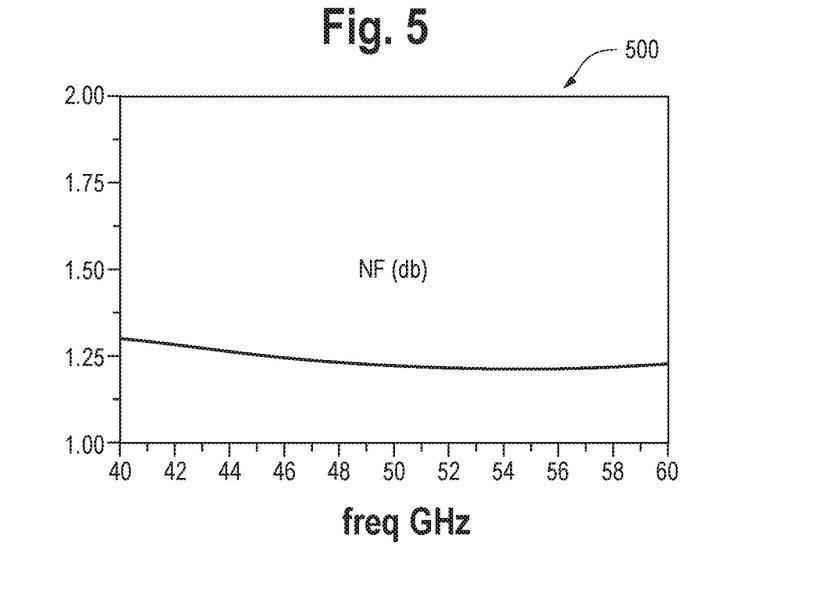
FIGS. 5 and 6 are graphs of noise figure for the embodiment shown in FIG. 5 before and after device extraction, respectively.
Figure 6:
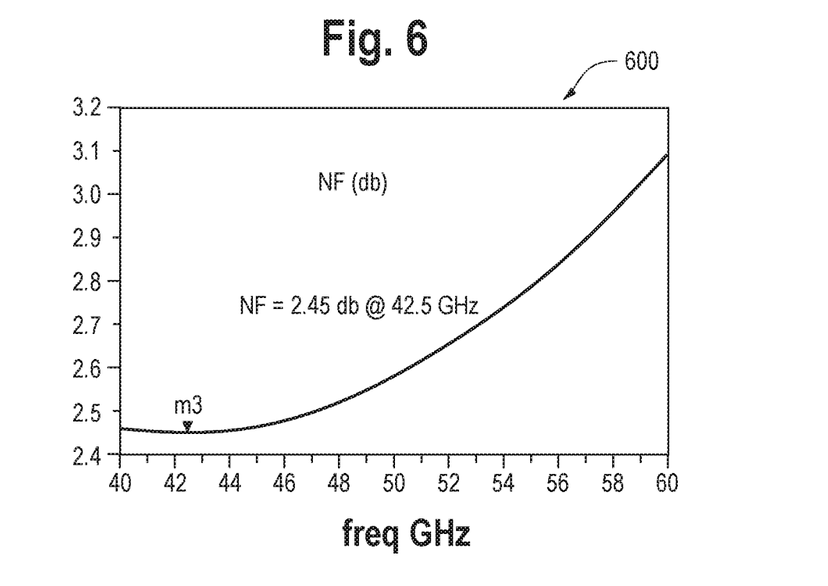

FIGS. 5 and 6 are graphs 500 and 600 of noise figures for the embodiment shown in FIG. 5 before and after device extraction, respectively. Device extraction, following an integrated circuit layout of the device, determines the resistance, capacitance, and inductance at various nodes of the device. It better predicts the actual realizable behavior of the device. As shown in FIG. 6, an extraction was performed and device capacitance and resistance at all significant nodes were calculated. As shown, a 3 dB NF, or less, over 20 GHz from 40 GHz to 60 GHz is achieved.

Figure 7:
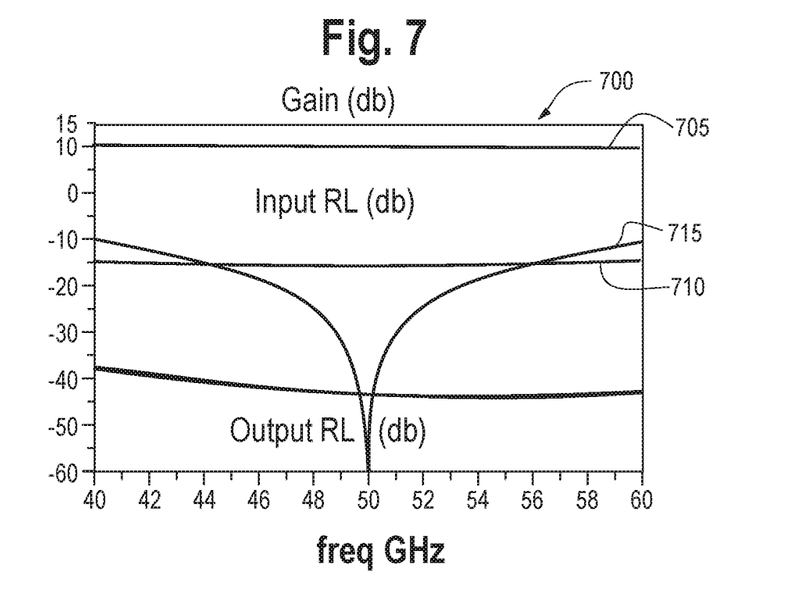
FIG. 7 is a graph showing gain and input/output return loss over the millimeter frequency range of 40-60 GHz for the embodiment shown in FIG. 5.

FIG. 7 is a graph 700 showing gain 705, input return loss 710 and output return loss 715 over the millimeter frequency range of 40-60 GHz for the embodiment shown in FIG. 5.

Figure 8:
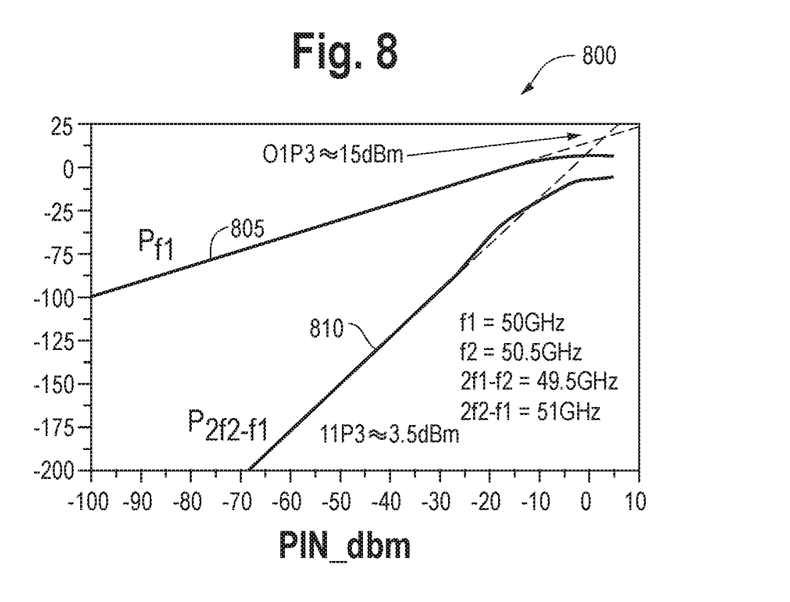
FIG. 8 is a graph showing third order distortion associated with the embodiment shown in FIG. 5.

FIG. 8 is a graph 800 that displays the results of a simulated two-tone test for third order distortion associated with the embodiment shown in FIG. 5. Graph 800 is a plot of a typical two-tone test. Two frequency signals f1 and f2 (with 0.5 GHz frequency spacing) are injected at the input of amplifier. The power of signals f1 and f2 are increased and powers for f1 signal, f2 signal, and distortion products at 2f1-f2 and 2f2-f1 are measured at the output of amplifier. Output Third-order Intermodulation Product (OIP3) is achieved from intersection of extrapolated power line slopes 805 and 810. The line slopes for 805 and 810 are 1 to 3, respectively. The predicted value of 15 dBm for OIP3 is very good for low power applications at MMW frequencies.

Additional linearization techniques can be applied to the NCLNA circuit without adversely effecting NF and input matching, for example, Derivative Superposition (DS). DS takes advantage of the complementary nature of T4/T5 in the input amplification stage. By biasing the gates of PMOS (T5) and NMOS (T4) differently, and/or by adjusting individual physical size of T4 vs. T5, nonlinear transconductance coefficients (third derivative of Id versus Vgs) that are out of phase are generated and cancel after addition since both devices T4/T5 share a common drain current. This results in further Input Third-order Intermodulation Products (IIP3) improvement as a result of reduction in third-order nonlinearity coefficient within drain current. An IIP3 of well beyond 5 dBm is achievable using the above linearization techniques. Although transistors T4, T5 and T1 share a common gate voltage as shown in FIG. 4, providing an AC only coupling of T1 transistor to T4/T5 (e.g. using a series capacitor) can enhance DS linearization. This would of course require the addition of a bias resistor/circuit to provide T1 gate with an independent gate bias voltage.

Although exemplary implementations of the invention have been depicted and described in detail herein, it will be apparent to those skilled in the art that various modifications, additions, substitutions, and the like can be made without departing from the spirit of the invention. For example, although all the components of the illustrative embodiments are envisioned as being incorporated within a CMOS SOI substrate, other semiconductor technologies could be used for implementations that address similar or different frequencies of operation.

The scope of the invention is defined in the following claims.

The invention claimed is:

1. A low noise amplifier having CMOS transistors and integral noise cancellation circuitry contained on a silicon on insulator substrate and configured to operate over a frequency range of 40 GHz to 60 GHz, the low noise amplifier comprising:

an amplifier using one or more of the CMOS transistors that amplifies a first signal and a first noise signal coupled to an input of the amplifier and generates corresponding amplified second signal and second noise signal, respectively, at an output of the amplifier, the second amplified signal being substantially 180 degrees out of phase relative to the phase of the first signal, the amplified second noise signal having substantially the same phase as the first noise signal, the first signal having a frequency in the range of 40 GHz to 60 GHz;

auxiliary amplifier using one or more CMOS transistors receives the first signal and the first noise signal at an aux input and generates at an aux output third and fourth signals that are amplified versions of the first signal and the first noise signal, respectively, the third and fourth signals each have a phase that is substantially 180 degrees relative to the phase of the first signal and first noise signal, respectively, an amount of amplification provided by the aux amplifier being substantially equal to an amount of amplification provided by the amplifier;

a summation circuit including one or more CMOS transistors receives the second signal, the second noise signal, the third signal and the fourth signal, and generates at a summation output a resultant signal where the resultant signal includes a constructive addition of the second signal and third signals, and a destructive addition of the second noise signal and the fourth signal, where the destructive addition results in substantial cancellation of the second noise signal and the fourth signal since the latter two signals are substantially equal in amplitude but have 180 degree opposite phases;

the CMOS transistors of the amplifier and the aux amplifier and the summation circuit being disposed on a single silicon on insulator substrate.

2. The low noise amplifier of claim 1 wherein the resultant signal has an associated noise figure of less than 3 decibels over the frequency range of 40 GHz to 60 GHz.

3. The low noise amplifier of claim 1 further comprising:
a feedback resistor connected to the amplifier controls the amount of amplification provided by the amplifier;
the aux amplifier having an unloaded amount of gain that is substantially the same as the gain provided by the amplifier for the second noise signal.

4. The low noise amplifier of claim 1 wherein:
the amplifier includes at least two CMOS transistors configured in cascode operation with respective drains connected together as the output of the amplifier;
the aux amplifier includes at least two CMOS transistors connected in cascode with each other and with the at least one CMOS transistor of the summation device;
a cascode current source with high output impedance is connected to inject current into one of the cascode connected transistors of the aux amplifier and configured so that the injected current flows through the at least two CMOS transistors connected in cascode but does not flow through the at least one CMOS transistor of the summation circuit.

5. The low noise amplifier of claim 1 further comprising a frequency matching network, connected to the input of the amplifier, including at least one capacitor and one inductor configured to enhance impedance stability throughout the frequency range.

6. The low noise amplifier of claim 1 further comprising:
a high pass filter connected to the summation circuit that high pass filters the second signal and second noise signal prior to said signals being received by the summation device.

7. The low noise amplifier of claim 1 further comprising:
at least one inductor, connected in series with the one or more transistors of the auxiliary amplifier, configured to provide inductive degeneration that stabilizes impedance over the frequency range by compensating for internal capacitance associated with the one or more transistors of the auxiliary amplifier.

8. A semiconductor amplifier comprising:
an amplifier using one or more transistors that receives at an input a first signal to be amplified, the amplifier amplifying the first signal to generate a corresponding second signal at an output of the amplifier, a first noise signal also present at the input is amplified as a second noise signal at the output, the second signal being substantially 180 degrees out of phase relative to the phase of the first signal, the amplified second noise signal having substantially the same phase as the first noise signal;
an auxiliary amplifier using one or more transistors has an aux input that receives the first signal and the first noise signal and also has an aux output on which third and fourth signals are generated where the third and fourth signals are amplified versions of the first signal and the first noise signal, respectively, the third and fourth signals each have a phase that is substantially 180 degrees relative to the phase of the first signal and first noise signal, the amplification provided by the aux amplifier being substantially equal to the amount of noise amplification by the amplifier;
a summation device including one or more transistors receives as inputs the second signal, the second noise signal, the third signal and the fourth signal, and generates at a summation output a resultant signal where the resultant signal includes a constructive addition of the second signal and third signals, and a destructive addition of the second noise signal and the fourth signal, where the destructive addition results in substantial cancellation of the second noise signal and the fourth signal since the latter two signals are substantially equal in amplitude but have 180 degree opposite phases, wherein the second noise signal present at the output of the amplifier is substantially canceled from the resultant signal.

9. The semiconductor amplifier of claim 8 wherein the amplifier and aux amplifier are configured to amplify the respective received signals over a range of frequencies of 40 GHz to 60 GHz and the resultant signal has an associated noise figure of less than 3 decibels over the frequency range of 40 GHz to 60 GHz.

10. The semiconductor amplifier of claim 8 wherein the amplifier, the aux amplifier and the summation device comprise CMOS transistors fabricated on a silicon on insulator substrate.

11. The semiconductor amplifier of claim 10 further comprising:
at least one inductor, connected in series with at least one of the transistors of the auxiliary amplifier, configured to provide inductive degeneration that stabilizes impedance over the frequency range by compensating for internal capacitance associated with the at least one transistor of the auxiliary amplifier.

12. The semiconductor amplifier of claim 8 wherein the amplifier includes at least two CMOS transistors configured in cascode operation with respective drains connected together.

13. The semiconductor amplifier of claim 8 further comprising a frequency matching network connected to the input of the amplifier including at least one capacitor and one inductor configured to enhance impedance stability over the frequency range.

14. The semiconductor amplifier of claim 8 further comprising:
a feedback resistor connected to the amplifier controls the amount of amplification provided by the amplifier;
the auxiliary amplifier including at least one CMOS transistor having an unload gain, the controlled amount of amplification of the amplifier being substantially greater than the unloaded gain of the auxiliary amplifier.

15. The semiconductor amplifier of claim 8 further comprising:
summation device includes at least one CMOS transistor;
the auxiliary amplifier includes at least two CMOS transistors connected in cascode with each other and with the at least one CMOS transistor of the summation device;
a cascode current source with high output impedance is connected to inject current into one of the cascode connected transistors of the auxiliary amplifier and is configured so that the injected current flows through at least the transistors of the auxiliary amplifier but does not flow through at least one CMOS transistor of the summation device.

16. The semiconductor amplifier of claim 15 wherein one of the at least two CMOS transistors of the auxiliary amplifier is configured for common source operation and another of the at least two CMOS transistors of the auxiliary amplifier is configured for common gate operation.

17. The semiconductor amplifier of claim 8 further comprising:
a high pass filter connected to the summation device that high pass filters the second signal and second noise signal prior to said signals being input to the summation device.

18. An amplifier with integral noise cancellation circuitry configured to operate over a frequency range in the gigahertz frequency spectrum, the amplifier comprising:
an amplifier stage that amplifies a first signal and a first noise signal coupled to an input of the amplifier stage and generates corresponding amplified second signal and second noise signal, respectively, at an output of the amplifier, the second amplified signal being substantially 180 degrees out of phase relative to the phase of the first signal, the amplified second noise signal having substantially the same phase as the first noise signal, the first signal having a frequency in the gigahertz frequency spectrum;
auxiliary amplifier stage receives the first signal and the first noise signal at an aux input and generates at an aux output third and fourth signals that are amplified versions of the first signal and the first noise signal, respectively, the third and fourth signals each have a phase that is substantially 180 degrees relative to the phase of the first signal and the first noise signal, respectively, an amount of amplification provided by the aux amplifier being substantially equal to an amount of amplification provided by the amplifier;
an active device summation circuit received the second signal, the second noise signal, the third signal and the fourth signal, and generates at a summation output a resultant signal where the resultant signal includes a constructive addition of the second signal and third signals, and a destructive addition of the second noise signal and the fourth signal, where the destructive addition results in substantial cancellation of the second noise signal and the fourth signal since the latter two signals are substantially equal in amplitude but have 180 degree opposite phases.

19. The amplifier of claim 18 further comprising:
the amplifier stage, auxiliary amplifier stage and active device summation circuit each comprising at least one CMOS transistor and all being disposed on a single substrate.

20. The amplifier of claim 18 further comprising:
a high pass filter connected to the active device summation circuit that high pass filters the second signal and second noise signal prior to said signals being received by the active device summation circuit; and
at least one inductor, connected in series with the auxiliary amplifier stage, configured to provide inductive degeneration that stabilizes impedance over the frequency range by compensating for internal capacitance associated with the one or more transistors of the auxiliary amplifier stage.

* * * * *

UNITED STATES PATENT AND TRADEMARK OFFICE
CERTIFICATE OF CORRECTION

PATENT NO. : 10,879,851 B2
APPLICATION NO. : 16/399599
DATED : December 29, 2020
INVENTOR(S) : Manouchehr Ghanevati et al.

It is certified that error appears in the above-identified patent and that said Letters Patent is hereby corrected as shown below:

In the Claims

In Column 10, Line 5, please delete "received" and substitute "receives".

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*